United States Patent
Koops (10) Patent No.: US 9,583,298 B2
(45) Date of Patent: Feb. 28, 2017

(54) NANO GRANULAR MATERIALS (NGM) MATERIAL, METHODS AND ARRANGEMENTS FOR MANUFACTURING SAID MATERIAL AND ELECTRICAL COMPONENTS COMPRISING SAID MATERIAL

(71) Applicant: HAWILKO GMBH, Ober-Ramstadt (DE)

(72) Inventor: Hans W. P. Koops, Ober-Ramstadt (DE)

(73) Assignee: HAWILKO GMBH, Ober-Ramstadt (DE)

(*) Notice: Subject to any disclaimer, the term of this patent is extended or adjusted under 35 U.S.C. 154(b) by 0 days.

(21) Appl. No.: 14/426,583

(22) PCT Filed: Sep. 6, 2013

(86) PCT No.: PCT/EP2013/068420
§ 371 (c)(1),
(2) Date: Mar. 6, 2015

(87) PCT Pub. No.: WO2014/037475
PCT Pub. Date: Mar. 13, 2014

(65) Prior Publication Data
US 2015/0255239 A1 Sep. 10, 2015

(30) Foreign Application Priority Data
Sep. 7, 2012 (EP) ..................................... 12183564

(51) Int. Cl.
*H01J 43/00* (2006.01)
*H01J 1/304* (2006.01)
(Continued)

(52) U.S. Cl.
CPC .............. *H01J 1/304* (2013.01); *B82Y 10/00* (2013.01); *C23C 14/28* (2013.01); *C23C 14/30* (2013.01);
(Continued)

(58) Field of Classification Search
CPC .......... H01J 1/304; H01J 43/246; H01J 19/38; H01J 19/57; H01J 9/025;
(Continued)

(56) References Cited

U.S. PATENT DOCUMENTS 4,324,854 A * 4/1982 Beauchamp ............ C03C 17/09
117/103
6,246,055 B1 6/2001 Koops et al.
(Continued)

FOREIGN PATENT DOCUMENTS

EP 2441796 A1 4/2012
WO 2004014794 A2 2/2004
WO 2008147477 A2 12/2008

OTHER PUBLICATIONS

International Search Report (Feb. 4, 2014) for for corresponding International Application PCT/EP2013/068420.
(Continued)

*Primary Examiner* — Donald Raleigh
(74) *Attorney, Agent, or Firm* — WRB-IP LLP (57) ABSTRACT

Nano granular materials (NGM) are provided that have the extraordinary capability to conduct current in a 100 fold current density compared to high Tc superconductors by charges moving in form of Bosons produced by Bose-Einstein-Condensation (BEC) in overlapping excitonic surface orbital states at room temperature and has a light dependent conductivity. The material is disposed between electrically conductive connections and is a nano-crystalline composite material. Also provided are electrical components
(Continued)

comprising NGM and methods and arrangements for making it by corpuscular-beam induced deposition applied to a substrate, using inorganic compounds being adsorbed on the surface of the substrate owing to their vapor pressure, and which render a crystalline conducting phase embedded in an inorganic insolating matrix enclosing the material.

25 Claims, 8 Drawing Sheets (51) Int. Cl.
| | |
|---|---|
| B82Y 10/00 | (2011.01) |
| H01B 1/14 | (2006.01) |
| H01B 1/16 | (2006.01) |
| H01B 1/20 | (2006.01) |
| H01B 1/22 | (2006.01) |
| H01J 9/02 | (2006.01) |
| C23C 14/28 | (2006.01) |
| C23C 14/30 | (2006.01) |
| H01J 19/38 | (2006.01) |
| H01J 19/57 | (2006.01) |
| H01J 43/24 | (2006.01) |

(52) U.S. Cl.
CPC ............... *H01B 1/14* (2013.01); *H01B 1/16* (2013.01); *H01B 1/20* (2013.01); *H01B 1/22* (2013.01); *H01J 9/025* (2013.01); *H01J 19/38* (2013.01); *H01J 19/57* (2013.01); *H01J 43/246* (2013.01); *H01J 2201/3048* (2013.01); *H01J 2201/30488* (2013.01); *H01J 2201/30496* (2013.01)

(58) Field of Classification Search
CPC ...... H01J 2201/30496; H01J 2201/3048; H01J 2201/304; C23C 14/30; C23C 14/28; H01B 1/14; H01B 1/16; H01B 1/20; H01B 1/22; B82Y 10/00
USPC .......................................... 252/500; 313/309
See application file for complete search history.

(56) References Cited

U.S. PATENT DOCUMENTS

| | | | |
|---|---|---|---|
| 6,648,711 B1 | 11/2003 | Jang et al. | |
| 2002/0034094 A1 | 3/2002 | Saito et al. | |
| 2002/0110707 A1* | 8/2002 | Kirino | G11B 5/656 428/835 |
| 2005/0156161 A1* | 7/2005 | Hanna | H01L 51/0012 257/40 |
| 2006/0284537 A1* | 12/2006 | Tolt | H01J 1/304 313/306 |
| 2007/0003472 A1* | 1/2007 | Tolt | H01J 1/304 423/447.3 |
| 2011/0129945 A1 | 6/2011 | Wise | |

OTHER PUBLICATIONS

Li Y et al: 11 Numerical simulation of field emission efficiency of anodic aluminum oxide carbon nanotube field emitter in the triode structure . Computer Physics Communication. Elsevier Science Publishers B.V. Amsterdam, NL. vol. 179. No. 1-3, Jul. 1, 2008 (Jul. 1, 2008), pp. 107-111, XP022704235, ISSN: 0010-4655. DOI: 10.1016/J.CPC.2008.01.026 [retrieved on Jan. 30, 2008].

* cited by examiner

NANO GRANULAR MATERIALS (NGM) MATERIAL, METHODS AND ARRANGEMENTS FOR MANUFACTURING SAID MATERIAL AND ELECTRICAL COMPONENTS COMPRISING SAID MATERIAL

BACKGROUND AND SUMMARY OF THE INVENTION

The invention refers to a nano granular material (NGM) comprising electrically conducting nano crystals embedded in an insulating matrix and surrounding layer. The material carries a high current density by variable range hopping, of electrons between the nano crystals.

U.S. Pat. No. 6,246,055 discloses a nano granular material as well as a photon detector made thereof, which delivers at low light photon quantities and energies usable for signals. The photon detector is partly composed from a nanocrystalline phase and is included in an insulating carbon matrix and which is producible with simple production machines and processes. The production of similar materials using organometallic precursors is described in: H. W. P. Koops, A. Kaya, M. Weber. "Fabrication and Characterization of Platinum nano crystalline Material Grown by Electron-beam Induced Deposition", J. Vac. Sci. Technol, B 13(6) November/December (1995) 2400-2403. High resolution Transmission-electron microscope image at 200 kV reveals 12 to 14 lattice planes of the platinum or gold single crystals of 0.408 nm distance. 800 to 1000 atoms form a perfect crystal embedded into a Fullerene matrix.

Crystal sizes are for Au/C: 3-4 nm obtained from Dimethyl-Gold-Trifluoro-Acetylacetonat, and for Pt/C: 1.8-2.1 nm deposited from Cyclopentadienyl-Platin-trimethyl. [J. Kretz, M. Rudolph, M. Weber, H. W. P Koops, "Three Dimensional Structurization by Additive Lithography, Analysis of Deposits using TEM and EDX, and Application for Field Emitter Tips" Microelectronic Engineering 23 (1994) 477-481]

However, there the matrix in Au/C and Pt/C materials is from Fullerene and presents a 2-D resistor surrounding the NGM material having a Fullerene matrix. This matrix is over the time of use etched away by water and activated gas ions. This limits the lifetime of the detector.

It is desirable to have a nano granular material with extraordinary properties like high current conductivity and radiation sensitivity with a long lifetime.

According to an aspect of the invention this task is solved by high current density carrying nano granular material comprising conducting nano crystals embedded in a matrix, wherein the matrix consists of insulating carbon-free material. Preferably the insulating material is an oxide, oxynitride or nitride. Even semiconductors can be used if they are insulating by surface depletion by their small layer thickness.

This invention is strictly different from the one taught in e.g. US Photo detector patent U.S. Pat. No. 6,246,055 B1. There the nano crystalline material is produced from organometallic precursors and has a carbonaceous matrix of low conductivity. Such a material is destroyed by a reaction of the carbonaceous compounds in the matter and in the surrounding surface, which takes place in the presence of excited water or gas atoms which are delivered from the environment and excited by the electromagnetic radiation, which is to be detected.

The carbon-free matrix and coating prevents in an advantageous way the destruction of the current leading wire or sheet, switch, photo detector, or solar cell due to reaction with surrounding materials like water or atmospheric gases, which are excited by the impinging energetic photons.

The material according to an aspect of the invention enables many applications and new electrical components, whereby a separation between the nano crystals is smaller than 2 nm. If required in particular cases the separation can be made larger, e. g. up to 5 nm.

In a preferred electrical component the material is shaped as a thin layer, having an entrance plane for radiation and electrodes for applying, an electrical field to the material.

In one embodiment of this inventive component said electrodes are electrically connected to the material. Such component can be used as detector for visible light, ultraviolet radiation or X-rays.

In another embodiment of this inventive component said electrodes are electrically insulated from the material and further collectors are electrically connected to opposite edges of the material. Exited by a weak electrical field provided by the insulated electrodes incident light causes the electrons to flow to one of the collectors at d the holes to flow to the other one of the collectors. Therefore this embodiment is a high efficient solar cell. Detailed explanations follow in connection with the drawings.

In another electrical component comprising material according to an aspect of the invention the material forms field emitter tips being arranged in vacuum cells which are formed by two planes, at least one of which is transparent for photons, and spacers between the planes, the transparent plane is covered with a luminescent layer in each cell, said field emitter tips are arranged opposite to the luminescent layers and the spacers carry an accelerator grid. This component generates light very effectively.

In a further development of this electrical component said cells form groups having luminescent layers of different colors within each group. This enables different colors of the light at the application as a light source e or as a display, if said field emitter tips or groups of said field emitter tips can be activated separately from each other.

To improve focusing of the emitted electrons in this electrical component an extractor can be attached to each of said field emitter tips.

A further embodiment of the electrical component can serve as radiation detector wherein the material forms field emitter tips which are arranged on a transparent support plane with tip structures and wherein the field emitter tips emit electrons which occupy the excited excitonic levels being lifted to those energy levels by incident photons of IR-, visible-, or X-radiation due to the extraction voltage between the emitter tips and a micro channel plate and co-act with a charge detector array through the micro channel plate.

Another embodiment of the electrical component forms a high voltage and high current switch, wherein the material forms an array of field emitter tips being arranged as cathode at one end of a vacuum tube and wherein the vacuum tube comprises further an anode and near the cathode an extractor. Preferably the extractor is arranged co-planar to the cathode or below (opposite to the anode) an insulating layer carrying the cathode and is used to switch the emission with a low voltage. This embodiment can further be improved by at least one accelerator dynode.

In an advantageous method for manufacturing material according, to an aspect of the invention a high energy electron, ion or photon beam is directed on a sample producing secondary electrons, wherein multiple inorganic molecules and metallic precursor gas are supplied, which are dissociated by said secondary electrons resulting in the deposition of the insulating matrix and metallic nano crystals embedded therein.

An arrangement for manufacturing material according to an aspect of the invention comprises in a vacuum chamber an electron, ion or photon beam source as a deposition system and a computer controlled multiple inorganic molecules and metallic precursor gas supply system.

An arrangement for manufacturing electrical components according to an aspect of the invention with areal field emitter tips comprises in a vacuum chamber an electron, ion or photon beam reducing image projection systems as a deposition system having a computer controlled multiple inorganic molecules and metallic precursor gas supply system in a structured fashion to define areal arrangements of field emitter tips.

The invention, according to an aspect thereof, relates further to an arrangement for manufacturing elongated forms of material according, to an aspect of the invention, which comprises in a vacuum chamber an electron, ion or photon beam source as a deposition system and a computer controlled multiple inorganic molecules and metallic precursor gas supply system and comprises further a transport system for the elongated material in order to move the material through a reaction area. Preferably this arrangement comprises means for maintaining temperature of the material in the reaction area. This solves the problem to deposit large areas of the NGM Material.

Another arrangement for manufacturing material according to an aspect of the invention by electron, ion or photon beam shadow mask image projection system uses a deposition system having a computer controlled multiple precursor gas supply system and the anode drop of a gas discharge areal energy source to deposit in a structured fashion NGM material for arrays of field emission electron or ion sources, for sheets, for long wire deposition, for power cables, for multiple pixel aerial photon detectors, for fast imaging in the IR, visible and X-ray regime, as well as for solar cells. For the purpose of enlarging the area this arrangement can be improved further by an electrostatic or magnetic multi beam deflection capability.

Another advantageous method for manufacturing nano granular materials according to an aspect of the invention uses especially tip arrays replicated with nano-imprint lithography means and then supplied with field emitter tips by high field material deposition using a deposition system having a computer controlled multiple precursor gas supply system, with the refined method of measuring the electron field emission by a computer evaluation of the emission on current during the tip growth process in an intermediate step in very short times compared to the tip growth process and to stop the growth for all parallel growing tips by a computer evaluation of the emission at a defined emission current.

A further development of this method is characterized in that the intermediate measurement of emission characteristics presents also a method to renew all tips by using a deposition system having a computer controlled multiple precursor (more than 1) gas supply system also equipped with halogens to etch all tips in the large area emitter structure and to re-grow the tips to the previous perfection with the high-field chemistry 1, 2 or 3 molecule deposition process.

Such process per se is published in:
M. Bischoff Int. Journal of Electronics 1992, Vol. 73 No. 5, 827-828

H. B. Linden, e. Hilt, H. D. Beckey, J. Phys. E: sci. Instruments. Vol 11 1987 1033 "High rate growth of dentrites on thin wire anodes for field desorption mass spectrometry"

J. T. L. Thong "Metallic Nanowires grown via field emission induced growth as electron sources" IVNC 2013 Tech digest 1 21 page 94.

In the following the matrix of the inventive material is referred to as M, e. g. Au/M means gold nano crystals in such matrix.

The invention, according to an aspect thereof, enables material for high current conducting wires and sheets, for bright electron and ion sources, as well as for photon detectors. The task is solved, using an energetic electron impact process, which produces the material fabricated as a nano-crystalline material, which is composed from conducting metal- or metal compound nanocrystals embedded into an insulating oxide, oxinitride or nitride matrix, which also surrounds the material with a non-conducting oxide, oxinitride or nitride layer, or by a semiconducting material which is in its surface states depleted by the small geometry. The nano crystals are having a dimension of smaller than 15 nm diameter and the intermediate insulating layer is thinner than 2 nm between the nano crystals, which is the reason for single charge moving from nano crystal to nano crystal using excited excitonie surface orbital states, which overlap to the ones of neighboring crystals and therefore free electrons and holes can form Bosons which are distributed through all the NGM material.

By the effect called Bose Einstein Condensation (BEC) positive and negative charges can form Bosons, which allows the condensation of many Bosons in one energy level. This is the reason for the very high current densities emitted from field emitter tips and being carried in thin wires at room temperature without destruction. (Literature: L. V. Butov et. al. "Towards Bose-Einstein Condensation of excitons in potential traps" in: NATURE/Vol. 47/47-52, 2. May 2002). Typically metals or metallic compounds have no bandgap in their energy level structure, and therefore cannot present Eigenstates of distinct separation to absorb energy from photons. Si has a bandgap of 1.5 eV and can therefore absorb electromagnetic radiation energy quanta with this value. That leads to ca. 16% effectivity in Si-solar cells in the visible spectrum collecting energy from the sun.

In addition the geometry quantization of the nano-crystals, which have a diameter below 10 nm, prevents that high energy phonons, like in 3-dimensional electron gas materials, like normal crystalline metals or metal alloy conductors, can be excited.

This is due to the fact that inside the nano crystal only 8 to 12 lattice planes exist. The insulating matrix having, a different density than the crystal materials also prevents the impulse transfer to neighboring atom chains. According to Patton and Geller only the lower energy state for acoustic phonons is occupied, which has an energy of 2 meV corresponding to a temperature of 23.2 K or −250° C. (Patton, K. R. & Geller, M. Phonons: in "A nanoparticle mechanically coupled to a substrate", Phys. Rev. B 67, 155418 (2003).

Therefore photo detectors from such materials do not need an additional power consuming Peltier cooler to reach the detection limit at 8 μm photon wavelength (for the Au/M compound or 4 nm crystal diameter), like commercial infrared cameras need to have.

Due to the fabrication method with an energetic electron impact on adsorbed molecules many for semiconductor photo-detectors required technology fabrication steps are avoided which makes the production of NGM current leads and detectors much cheaper.

Very small amounts of the compound material are sufficient to detect photons. In earlier experiments to measure the effectivity ala photon detector from Au/M deposited from Dimethyl-Gold-Acetylacetonate with the dimensions of 2 mm×50 nm wire width and thickness showed at illumination with a lamp of 60 W power a photocurrent of several nA. Resistive change was 10 MΩ to 3 MΩ. A Voltage change by 2 meV is good for 12 bit image contrast at 1 μV amplifier noise level.

Aerial detectors of 2 μm×2 μm deposited from Pt/M material showed similar results. Recently (not published jet) we measured from Pt/M wires of an area of 0.32 μm$^2$ an photocurrent of 200 nA illuminating the area of the structure with a power density like the sun sends to the earth of 100 mW/mm$^2$. The solar light source delivers to the earth 1.36 kW/m$^2$=1.36 10$\hat{}$3/10$\hat{}$4 W/cm$^2$=0.136 W/cm$^2$=136 W/cm$^2$, which is 100 times less than the laser source intensity of our experiment.

Therefore the efficiency of this material, if produced in an aerial coating, would allow converting the energy from the sun with a so far not reached efficiency!

An experiment revealed: red light of 700 nm wavelength (=1.3 eV per quanta) with an intensity of 100 mW/mm$^2$ releases, if used with an intensity of 100 mW/mm$^2$ from the deposited area of 3.2 10$\hat{}$-9 cm$^2$ an electron current density 0.2 μA/3.2 10$\hat{}$-9 cm$^2$=2 10-7 A/3.2 10$\hat{}$-9=60 A/cm$^2$=60 A/cm$^2$. With a voltage difference of 0.12 V this would amount to 60×0.12 W/cm$^2$=7.2 W/cm$^2$ collection efficiency of the Pt/M material. With the solar light source of 136 mW/cm$^2$, which is 1/100 of the experimental condition the NGM Material would have collected 72 mW/cm$^2$. This is a significantly higher value (around 3), than Si solar cells, which convert 15% of this energy, which is 20.4 mW/cm$^2$, when using only yellow to blue light. NGM Pt/M materials efficiency in monochromatic red light is at least a factor of 3 higher than that of Si-solar cells.

Producing the nano granular material with a larger grain size would increase the number of electrons, which are excited by the photon and can tunnel through the NGM material, due to the effect of the reduction of the Eigenstate separation values of the electron orbitals at the crystal surface.

A crystal diameter of 2 nm correspond to an Eigenstate separation of 125 mV, 4 nm to 65 eV, 6 nm to 32.5 meV and 8 nm to 16 meV, which would correspond to a 100 times higher effectivity for electromagnetic radiation conversion compared to silicon or similar solar cells!

Therefore it is a task for the production of the crystals to select the deposition and materials composition conditions in a way that larger crystals are produced in the deposit. This can be achieved using additional reaction partners, which reduce the confining molecules which form the insulating matrix.

For hopping conduction it is necessary that the crystals have a separation from each other which is as small as <2 nm. However, if there is a separation larger than 2 nm, and no hopping conduction is possible, such materials are insulators. One method is to use a gas discharge with ions as it is used to coat tools e.g. with a hard layer of AlTiN with an amorphous $Si_3N_4$ insulator matrix material. [Lecture of H. Frank G F E at 3$^{rd}$ ITG Workshop on vacuum nano electronics at Bad Honnef 19.8.12] The crystals and intermediate oxide or nitride fit the expectations. However, the violet looking materials layers have not been investigated for optical and electrical activity so far.

Another method is to use a multi-source sputter deposition system with material flux control.

Another method is ALD Atomic Layer deposition with Multi-precursor reactions for conductive nano crystals and insulating embedding of the crystal grains in a repeated manner to form NGM material layers of several 100 nm thicknesses.

Another method is to use the as discharge in a large flat chamber to generate fast electrons with the anode fall for electrons to decompose and deposit to a target the adsorbed mixture of inorganic precursor molecules of several compounds as supplied to the gas phase in the discharge. Appropriate inorganic low vapor pressure compounds are the fluorines, or halogenes of Al and Ti, as well as Si. Also other compounds forming mixtures of conducting crystalline material from metals and nitrides or oxides can be used, but they must be selected with their condensation reaction energy which avoids, that they co-condense in an epitaxial way with the insulating phase which is embedding the nano crystals phase.

Typically the crystallographic system of the deposits of the compounds of the crystal core and the surrounding insulator should not match, and for the insulating phase a hindered epitaxy is needed which has an epitaxial temperature below the temperature of the crystals growing temperature.

Another way to fabricate the NGM materials in large areas is to use focused electron beam induced deposition using massive parallel electron beams from gas discharges, thermal source arrays, Thermofield electron source arrays or field emitter arrays produced by semiconductor technology and micromechanical means, especially using tip arrays replicated with nano imprint lithography means and then supplied with field emitter tips by high field material deposition.

DETAILED DESCRIPTION

Figure 1:
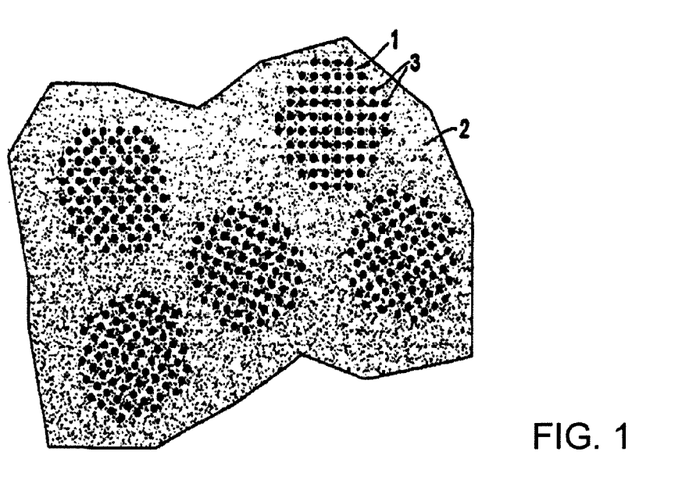
FIG. 1 shows schematically the composition of a Nano granular compound material

The nano granular material shown in FIG. 1 consists of conducting metal crystals which are composed of atoms 3 with interatomic spaces 1, and the nano crystals are embedded into an insulating, matrix 2 consisting of oxide, oxinitride or nitride.

Figure 2:
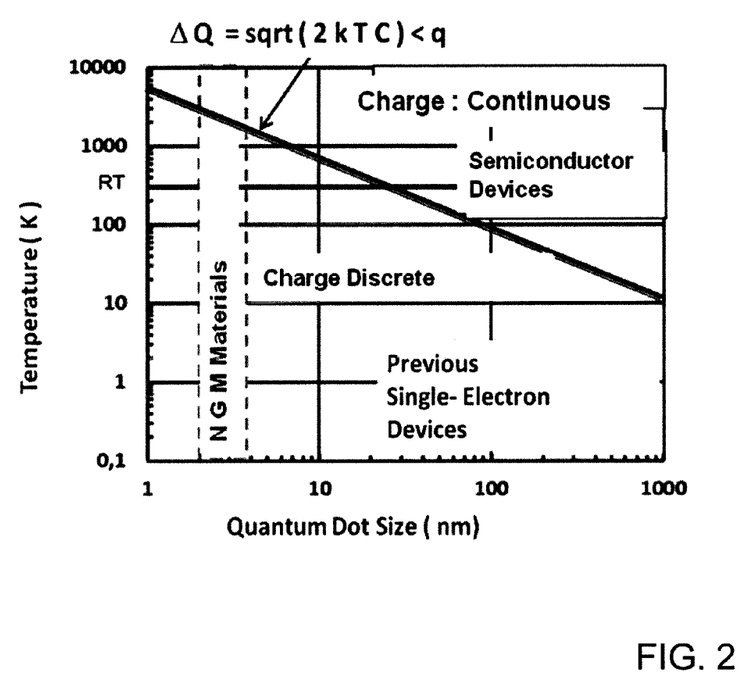
FIG. 2 shows in a schematic representation the region of crystal diameters for Coulomb blockade with full electron transitions even at room temperature

FIG. 2 shows in a diagram the region of crystal diameters for Coulomb blockade with full electron transitions even at room temperature. The nano granular material has a quantum dot size between 2 and 4 nm and therefore provides discrete charge transfers at room temperature and above, e.g. for Bose-Einstein-Condensation (BEC), and for filling up excitonic orbital levels around crystals with electrons, which come from the at room temperature occupied electronic states above the Fermi level of the metal, which are filled due to the Maxwellian energy distribution of electrons in metals.

Figure 3:
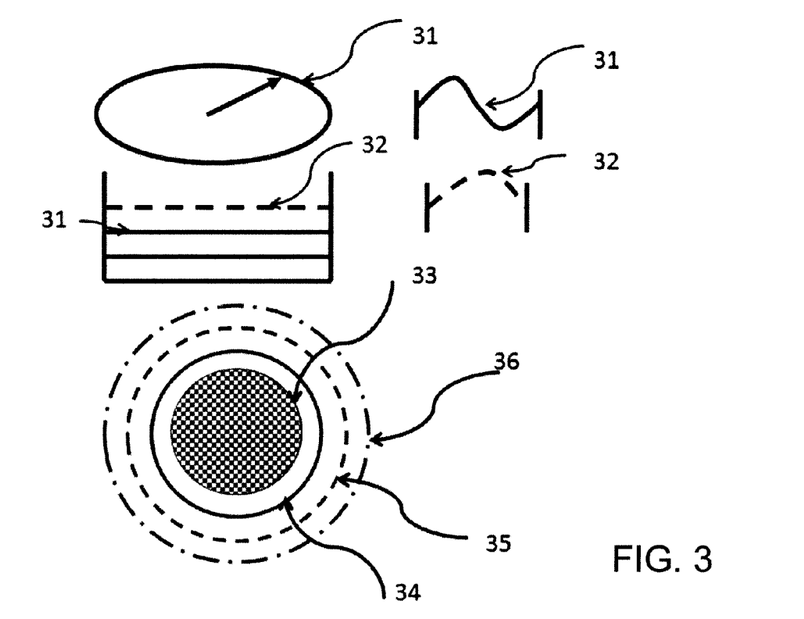
FIG. 3 presents the evaluation of surface electron orbitals using Bohr's Eigenvalue estimation from stable electron orbits and oscillations.

FIG. 3 shows for nano granular materials Bohr's Eigenvalue circular states 31 at rim surface orbitals(n1) with <120 meV level splitting an Bohr's Eigenvalue transmission states 32 (m*Lambda/2, with in an integer). The diameter of a nano crystal 33 may be in case of PT/M 2 nm an in case of Au/M 4 nm. In FIG. 3 further surface orbital states n=1, n=2 and n=3 labeled as 34, 35, 36 are depicted. These can form excitonic states which are overlapping to the excitonic states from the neighboring crystals and allow electron and holes to be distributed across all the NGM without resistive loss. The energy gap between exetinic orbital states is for Pt/M: 120 meV and for Au/M: 65 meV.

The NGM materials present with every crystal a photon energy trap. Due to the small size of the crystals, many parts of the photon energy can be absorbed by inelastic Raman-Scattering in a thin layer of NGM material, and also in neighboring crystals of the same layer. Therefore NGM materials are very efficient absorbers and require only a thin NGM material layer. This characteristic saves in an advantageous way materials due to the small thickness of the layer needed e.g. for a solar cell, E. g. 10 subsequent absorber levels correspond to a 20 nm layer thickness (Pt/M) or 40 nm (Au/M).

Figure 4:
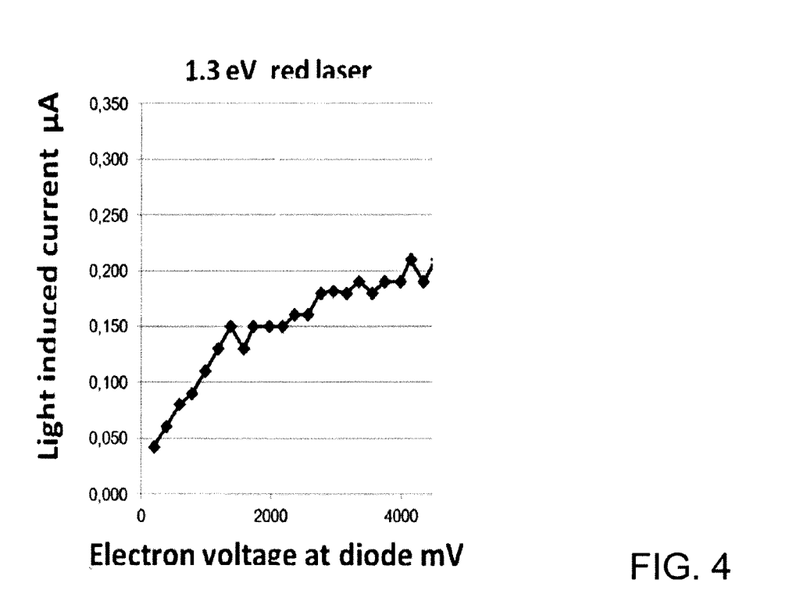
FIG. 4 presents a measurement of a light induced current in Pt/M

The diagram of FIG. 4 shows the light induced current as measured with an extraction voltage from a Pt/M deposited area of 3.2 100-15 cm$^2$ and red laser light illumination of 1.3 eV. A light induced current is measured starting from 0 volts in a field emission diode experiment, giving proof that electrons are released from the crystal by excitation of circular orbit excitonic electron states.

Figure 5:
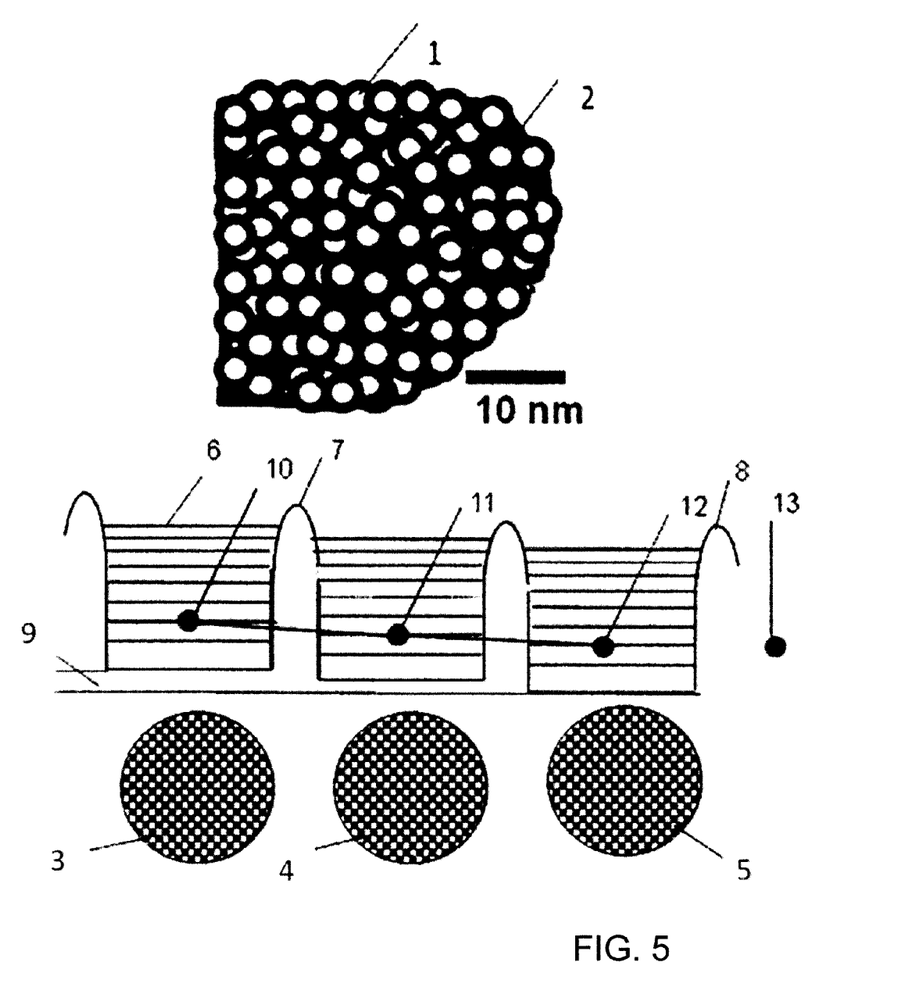
FIG. 5 is a schematic representation of a field emitter tip of NGM.

The upper part of FIG. 5 shows schematic representation of a field emitter tip of NGM with metal nano crystals 1 and an embedding insulator matrix 2 as it is displayed by a transmission electron microscope which superimposes all crystal images in one picture. The middle of FIG. 5 represents three potentials and equidistance eigenvalues of electrons in surface orbital of three single crystals with energy levels 6, tunneling barrier between crystals 7, tunneling barrier to vacuum 8, potential difference due to external voltage application 9, electron at energy level 10, electron after hopping to next crystal 11 electron after hopping to next crystal 12. The electron finally leaves the crystal 5 by tunneling through potential 8 as a field emitted electron 13. The bottom pan of FIG. 5 shows schematic diagrams of the single crystals 3, 4, 5.

Figure 6:
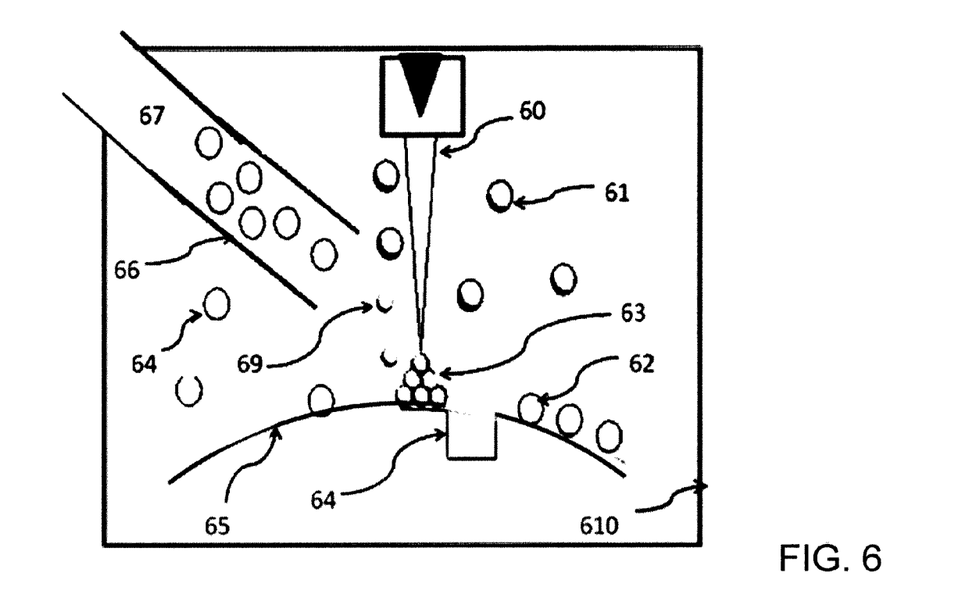
FIG. 6 shows a schematic diagram of an arrangement for producing NGM

FIG. 6 shows a schematic diagram of an arrangement for producing NGM. An electron beam source comprising a field emitter, or a thermofield emitter, a thermal or a gas discharge source, which is made of NGM generates an electron beam 60 which is directed on a substrate or sample respectively 65. Through a nozzle 66 precursor molecules 67 are supplied. All elements shown in FIG. 6 are arranged in a reaction chamber 610 containing high vacuum of about $10^{-4}$ to $10^{-7}$ mbar. The electron beam 60 generates secondary electrons which react with the precursor molecules 67 supplied through nozzle 66. This results in cracking the precursor molecules 67 in metallic atoms, which first condense to nano crystals 63 and insulating material, which forms a matrix in which the nano crystals are embedded. Precursor molecules 61 adsorbed precursor molecules 62 Radicals 69 from precursor molecules etched substrate material 64 due to forming of volatile reaction products in the reaction with the excited precursor gas.

Figure 7:
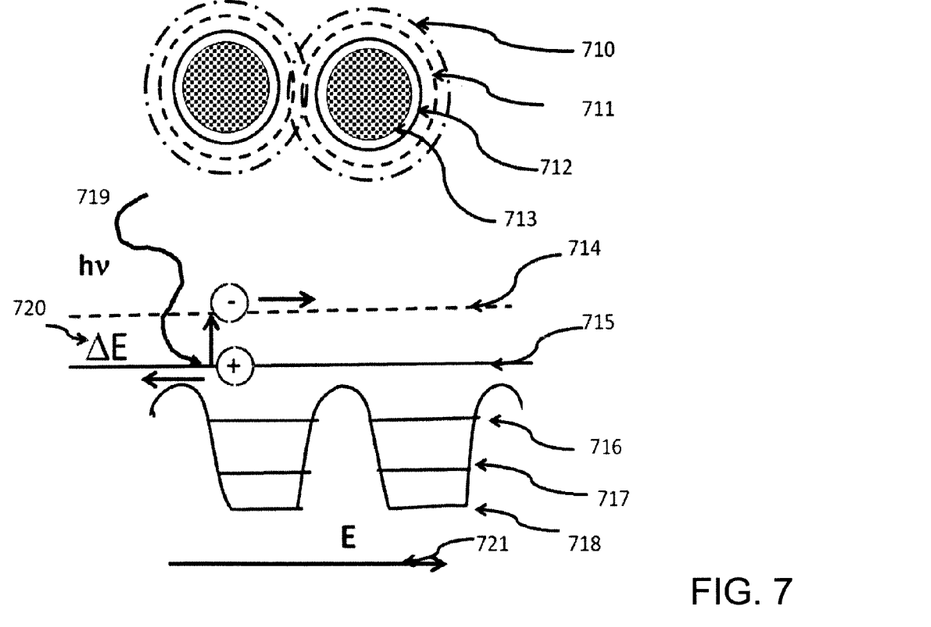
FIG. 7 is a schematic representation of the effect of an in incident photon.

FIG. 7 is a schematic representation of the effect of an incident photon. The upper part shows schematically two nano crystals 713 very near to each other with orbits 710, 711, 712, whereby the orbits 710, 711 of excited electrons, so called excited excitonic states, overlap. The overlapping excited excitonic states are the reason for the Bose-Einstein-Condensation forming Bosons, which are in high density in the level, and allow giant current densities and anomalous high current at room temperature in nano-granular materials with crystal diameters below 5 nm. An incident photon 719 boosts an electron from a lower exciton level 715 to a higher exciton level 714 absorbing energy 720. Lines 717 and 718 depict the surface and the inner orbital of the nano crystal. By virtue of an electric field 721 the electron on the energy level 714 721 moves to the right while the hole on the energy level 715 moves to the left. Electrons and holes can undergo Bose Einstein Condensation and form Bosons.

On an insulating substrate under energy supply with several eV electrons or ions to adsorbed layers Material deposition or etching, is formed from inorganic precursors containing at least one metal component, or several different metal components, and precursors containing insulator or oxide forming other metals or semiconductors with the influence of other radiation or energy delivering sources, which can also be especially selected to react with the organic components and form a volatile phase which does not condense in the NGM Material.

Deposition conditions are to be selected under the constraint to form nano granular deposits with crystals sizes between 1 nm and <15 nm, and being composed from nano crystals from a conducting metal or metal compound phase being embedded into an non-conducting and insulating phase with a very thin thickness between the crystals e.g. <2 nm.

Metals, semiconductors and their precursor compounds used comprise Beryllium, Boron, Silicon, Gallium, Indium, Germanium, Tin, Lead, Zinc, Iridium, Aluminium, Silver, Gold, Scandium, Titanium, Vanadium, Chromium, Manganese, Iron, Cobalt, Nickel, Copper, Zinc, Cadmium, Thallium, as well as their mixtures and their oxides, nitrides, oxi-nitrides, phosphides, halogens, and mixed metal compounds like Sn Zn Ox e.g. Spinel, Zn Sn Ga, Al Ti N. Insulating matrices being formed from Silicon-oxide, Silicon Nitride, Silicon-Oxi-Nitride and other mixtures of Metal oxides, Nitrides or Phosphines.

Figure 8:
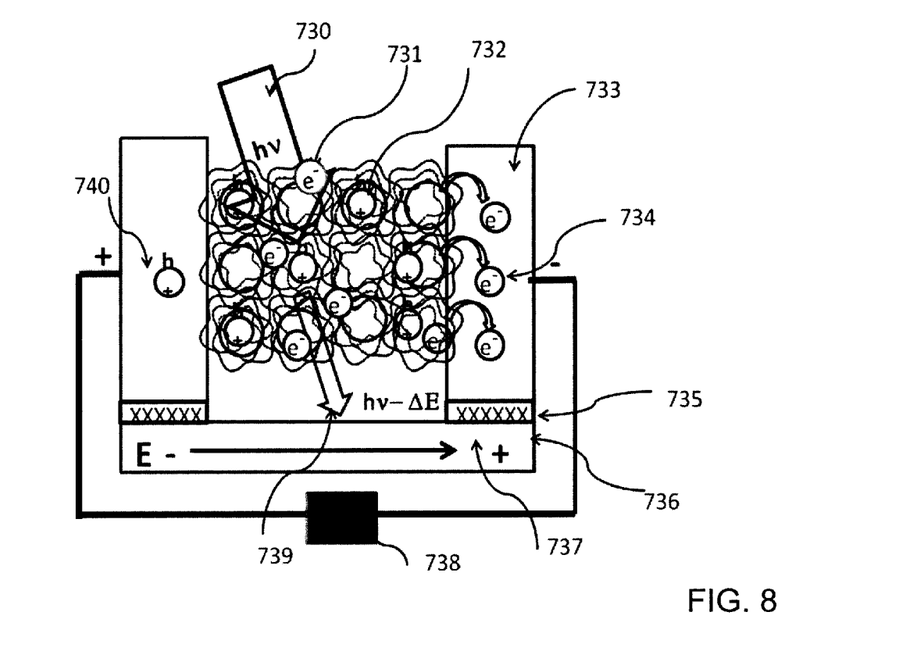
FIG. 8 shows a solar cell

FIG. 8 shows a section of a solar cell which converts the energy of electromagnetic radiation, e.g. sunlight, into electric energy. NGM is arranged between a positive collector 734 and a negative collector 740. A resistor 736 is insulated to the NGM by insulators 735 forming an electric field 737. Due to the impact of photons 730 on the NGM the electrons get higher energy level and are tunneling through the matrix in the direction which is given by the field 737. The excitonic electrons 731 move to the positive collector 734 and the excitonic hole to the negative collector 740. A rest 739 of the photon after energy loss leaves the NGM. As the NGM has a very low resistance the electrons cause a high current. But the voltage generated between the collectors 733 and 740 is relatively low, about 0.06 to 0.16 eV. The efficiency compared with the conventional solar cells is very high. The lower voltage can be compensated by cascading several cells, as it is performed also with Si-solar cells.

Compared to standard materials the inelastic Raman scattering process in NGM will have a high cross section, since excited electrons and holes do not suffer a by resistive phonon interaction decelerated conductivity, but face an unlimited speed to transport energy from the reaction place.

Figure 9:
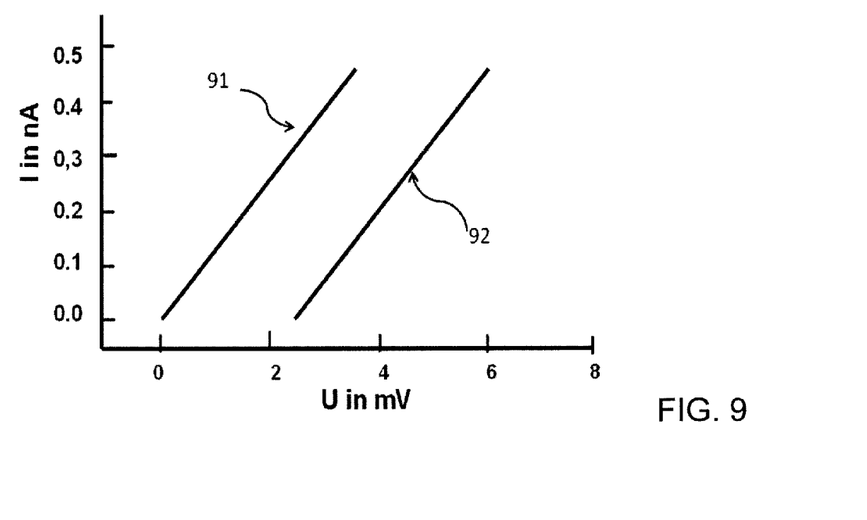
FIG. 9 shows a current/voltage plot of the photon detector made of NGM.

FIG. 9 shows a current/voltage plot of a photo resistor made of NGM having the dimensions of 1 μm×50 nm. Illuminated by light of a gas discharge lamp for white room light the curve 91 was measured. The curve 92 is taken in the dark. It becomes obvious that the voltage is considerable higher in the dark compared with light switched on. A structure of such a photo resistor is known by U.S. Pat. No. 6,246,055.

Figure 10:
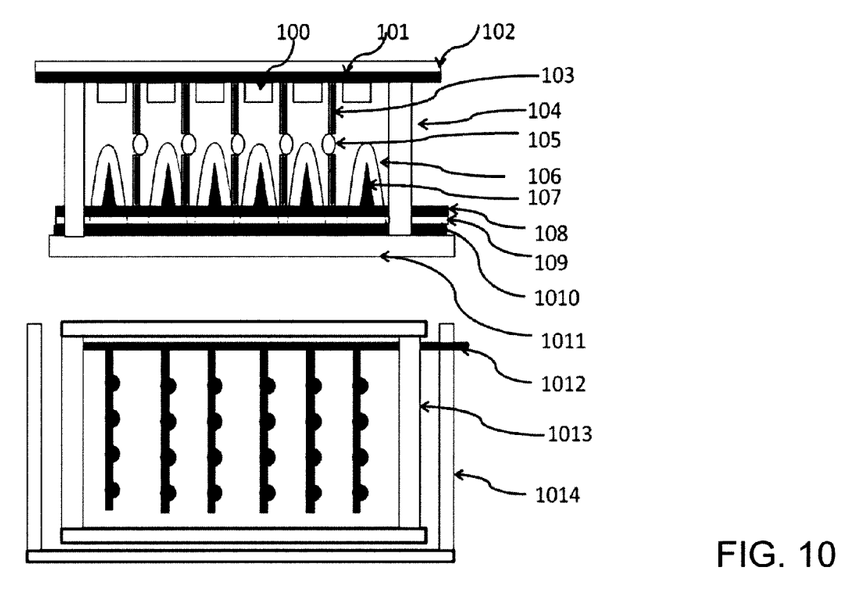
FIG. 10 shows a field-emitter fluorescent lamp

FIG. 10 shows the principle of a fluorescent lamp, which comprises two plates 102, 1011 building together with spacers 1013 a low pressure volume filled with noble gas like neon or xenon. Further spacers 103 divide the chamber into cells each of this contains an electron source consisting of an NGM emitter 107. The spacers 103 carry a grid 105. A conducting layer 108 on an insulating layer 109 leads a cathode voltage to the field emitter tips 107. A conducting layer 101 builds anodes and is covered by phosphor spots 100. Due to the nanogranular material dimensions the voltage required for field emission is strongly reduced due to the high field enhancement factor caused by the small radius of the electron emitting NGM crystal. Field emission for Au/M started at 8 V, instead at 70 V like Mo-Spindt cathodes do.

In operation the voltage Ug of the grid 105 accelerates the electrons emitted by the field emitters 107 in the direction to the anode 101. But this has a potential of Ua about 2V lower than the cathode potential Uk. Therefore the electrons do not land on layer 101 but oscillate in each cell and excite the noble gas to meta-stable states that radiates UV light hitting the phosphor 100. The UV light in turn is converted by the phosphor 100 into visible light.

Figure 11:
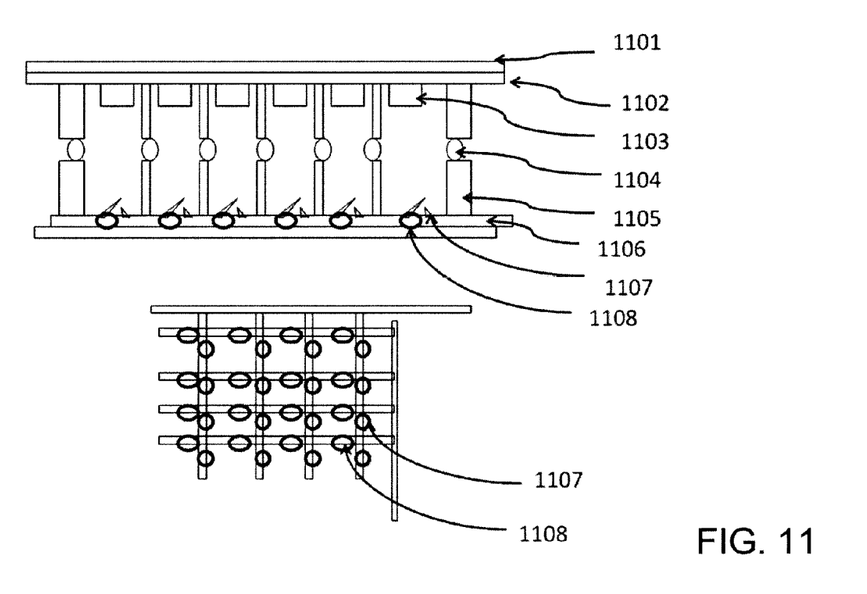
FIG. 11 shows a field-emitter image display

The image display shown in FIG. 11 has a similar structure as the fluorescent lamp shown in FIG. 10 and comprises two plates 1102 building together with insulating spacers 1105 a low pressure (e. g. 1 mbar) volume filled with noble gas like neon or xenon. Electrons oscillating around the grid (1104) excite the gas to metastable states, which then excite by mechanical collision with the phosphor the light emission. A high positive potential grid 1104 accelerates the electrons emitted by the field emitters 1107. The field emitters 1107 are separately controllable by provided extractors 1108. Further on, the cells are adapted to the number of pixels which are to be displayed and the dots of phosphor 1103 emit different colors.

Figure 12:
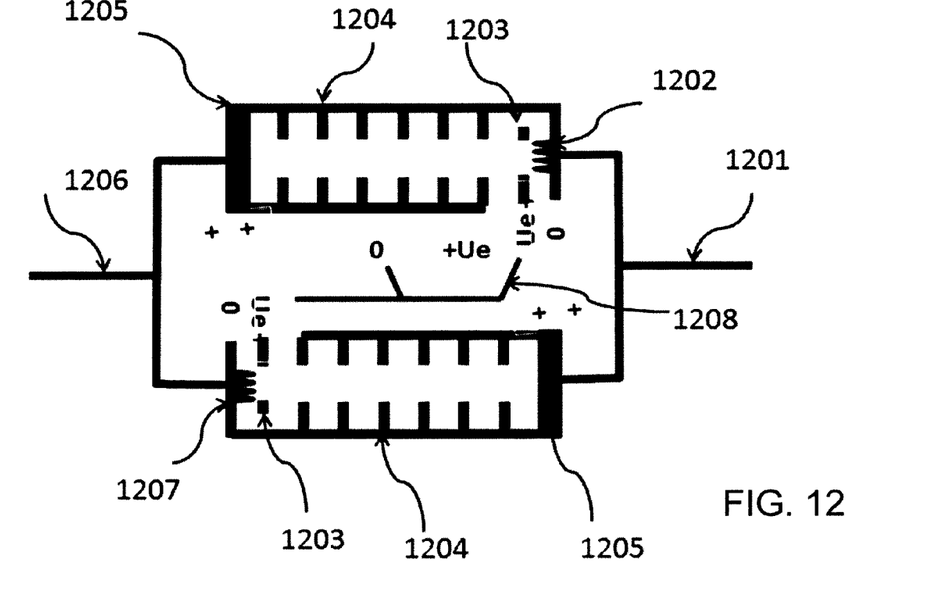
FIG. 12 shows a high power switch.

FIG. 12 shows a pair of power switches enabling to switch high voltage at high current, e.g. 3.80 kV and 1000 A. For each half wave on the line 1201 one switch is provided in opposite direction to each other. Both switches comprise arrays of field emitters forming cathodes 1202. Extractor voltages are supplied to electrodes 1201. The extractor voltages can be lower than 100 V and can be switched on and off to control the electron current flow between the cathodes 1202, 1207 and the anodes 1205. The extractor electrodes 1203 can be arranged in the planes of the field emitters cathodes 1202. Accelerator dynodes 1204 focus the electrons emitted by the cathodes on the anodes 1205. As well as the cathode base lines the extractor lines are fabricated as metal lines on an insulating substrate in one lift-off process.

Figure 13:
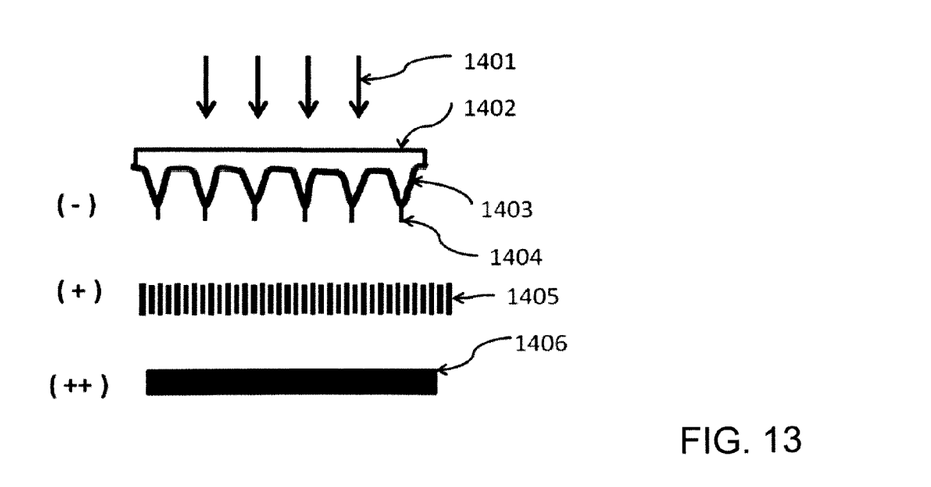
FIG. 13 shows an X-ray image detector.

The X-ray image detector shown in FIG. 13 comprises a transparent support 1402 made of SiO2 with tip structures as photo cathodes 1403 made of SiO2 or NIL (nanoimprint lithography) coated with NGM, e.g.by high field deposition to form field emitter tips 1404 which form a two dimensional array. Excited by incident photons 1401 electrons are field-emitted and move through a micro channel plate 1405, where they multiply the signal, and finally impinge to a charge detector array, from where corresponding signals can be taken.

Figure 14:
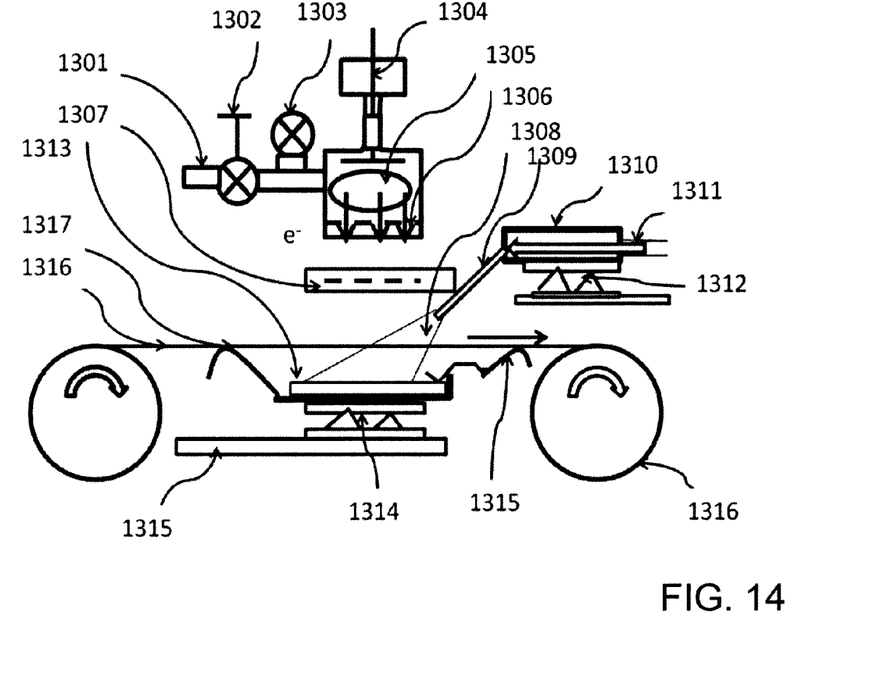
FIG. 14 shows an arrangement for manufacturing a conductor on an area, a wire or a ribbon.

All elements of the arrangement for manufacturing a conductor shown in FIG. 14 are within a vacuum reaction chamber, which is not depicted. Electrons used for EBID are produced by gas discharge. For this purpose a gas stream supplied at 1301 is controlled by a needle valve 1302 and a pressure meter 1303. A high voltage supply 1304 builds an electric field which provides a gas discharge 1305. The electrons of the ionized gas travel through holes in a grid anode 1306 and are accelerated by an adjustable voltage of a grid 1307 in order to define the energy of the elections which travel further towards to a plate 1313, e. g. of glass. The Gas discharge electron source can also be replaced by a thermal emitter array, a hot or cold field emitter array or corresponding, gas ion sources.

A precursor reservoir 1310, a valve 1311, a Peltier heater/cooler, and a nozzle 1309 are designed to supply a beam 1308 of precursor molecules. On the plate 1313, the temperature of which is controlled by a Peltier heater/cooler 1314, secondary electrons induced by the electrons produced by gas discharge react with the precursor molecules in the same way as described in connection with FIG. 6. A tape or wire 1316 moves from a supply reel to a winding reel. Thermal contacts 1315, 1317 care for a temperature of the tape or wire 1316, which is about the temperature of the plate 1313. The substrate temperature can also be adjusted by pre-cooling or pre-heating the substrate in an extra chamber before it enters the vacuum of the deposition chamber. This measure allows additional freedom for process control and precursor deposition before it's conversion by beam energy impact.

The invention claimed is:

1. High current density carrying nano granular material comprising conducting nano crystals embedded in a matrix, wherein the matrix consists of insulating carbon-free material, wherein a separation between the nano crystals is smaller than 2 nm.

2. Material according to claim 1, wherein the insulating material is an oxide.

3. Material according to claim 1, wherein the insulating material is an oxy-nitride.

4. Material according to claim 1, wherein the insulating material is a nitride.

5. Material according to claim 1, wherein the insulating material is a semiconductor.

6. Electrical component comprising material according to claim 1, wherein the material is shaped as a thin layer, having an entrance plane for radiation and electrodes for applying an electrical field to the material.

7. Electrical component according to claim 6, wherein the electrodes being electrically connected to the material.

8. Electrical component according to claim 7, wherein the electrodes being electrically insulated from the material and wherein further collectors are electrically connected to opposite edges of the material.

9. Electrical component comprising material according to claim 1, wherein the material forms field emitter tips being arranged in vacuum cells which are formed by two planes, at least one of which is transparent for photons, and spacers are between the planes, the transparent plane is covered with a luminescent layer in each cell, the field emitter tips are arranged opposite to the luminescent layers and the spacers carry an accelerator grid.

10. Electrical component according to claim 9 wherein the cells form groups having luminescent layers of different colors within each group.

11. Electrical component according to claim 9, wherein the field emitter tips or groups of the field emitter tips can be activated separately from each other.

12. Electrical component according to claim 9, wherein an extractor is attached to each of the field emitter tips.

13. Electrical component comprising material according to claim 1, wherein the material forms field emitter tips which are arranged on a for photons transparent support plane with tip structures and wherein the field emitter tips emit electrons which occupy the excited excitonic levels being lifted to those energy levels by incident photons of IR-, visible-, or X-radiation due to the extraction voltage between the emitter tips and a micro channel plate and co-act with a charge detector array through the micro channel plate.

14. Electrical component comprising material according to claim 1, wherein the material forms an array of field emitter tips being arranged as cathode at one end of a vacuum tube and wherein the vacuum tube comprises further an anode and near the cathode an extractor.

15. Electrical component, according to claim 14, whereby the extractor is arranged co-planar to the cathode or below (opposite to the anode) an insulating layer carrying the cathode and is used to switch the emission with a low voltage.

16. Electrical component according to claim 14 wherein the vacuum tube comprises further at least one accelerator dynode.

17. Arrangement for manufacturing electrical components according to claim 9, wherein in a vacuum chamber an electron, ion or photon beam reducing image projection systems as a deposition system having a computer controlled multiple inorganic molecules and metallic precursor gas supply system in a structured fashion to define areal arrangements of field emitter tips.

18. Method for manufacturing high current density carrying nano granular material comprising conducting nano crystals embedded in a matrix, wherein the matrix consists of insulating carbon-free material, comprising directing a high enemy electron, ion or photon beam on a sample producing secondary electrons, supplying multiple inorganic molecules and metallic precursor gas, dissociating the inorganic molecules and metallic precursor gas by the secondary electrons resulting in the deposition of the insulating matrix and metallic nano crystals embedded therein.

19. Arrangement for manufacturing high current density carrying nano granular material comprising conducting nano crystals embedded in a matrix, wherein the matrix consists of insulating carbon-free material, comprising, in a vacuum chamber, an electron, ion or photon beam source as a deposition system and a computer controlled multiple inorganic molecules and metallic precursor gas supply system.

20. Arrangement for manufacturing elongated forms of high current density carrying mine granular material comprising conducting nano crystals embedded in a matrix, wherein the matrix consists of insulating carbon-free material, comprising in a vacuum chamber an electron, ion or photon beam source as a deposition system and a computer controlled multiple inorganic molecules and metallic precursor gas supply system and comprising further a transport system for the elongated material in order to move the material through a reaction area.

21. Arrangement according to claim 20, comprising means for maintaining temperature of the material in the reaction area.

22. Arrangement for manufacturing high current density carrying nano granular material comprising conducting nano crystals embedded in a matrix, wherein the matrix consists of insulating carbon-free material, characterized by electron, ion or photon beam shadow mask image projection using a deposition system having a computer controlled multiple inorganic molecules and metallic precursor gas supply system and the anode drop of a gas discharge areal energy source to deposit in a structured fashion NGM material for arrays of field emission electron or ion sources, for sheets, for long wire deposition, for power cables, for multiple pixel aerial photon detectors, for fast imaging in the IR, visible and X-ray regime, as well as for solar cells.

23. Arrangement according to claim 22, comprising further an electrostatic or magnetic multi beam deflection capability.

24. Method for manufacturing nano granular high current density carrying nano granular materials comprising conducting nano crystals embedded in a matrix, wherein the matrix consists of insulating carbon-free material, wherein especially tip arrays are used replicated with nano-imprint lithography means and then supplied with field emitter tips by high field material deposition using a deposition system having a computer controlled multiple inorganic molecules and metallic precursor gas supply system, with the refined method of measuring the electron field emission current in very short times compared to the tip growth process during the tip growth process in an intermediate step and to stop at a pre-defined emission current the growth for all parallel growing tips by a computer evaluation of the emission at a pre-defined emission current.

25. Method according to claim 24, wherein the intermediate measurement of emission characteristics presents also a method to renew all tips by using a deposition system having a computer controlled multiple precursor (more than 1) gas supply system also equipped with halogens to etch all tips in the large area emitter structure and to re-grow the tips to the previous perfection with the high-field chemistry in a 1, 2 or 3 molecule deposition process.

* * * * *